United States Patent
Minzoni (10) Patent No.: US 7,116,148 B2
(45) Date of Patent: Oct. 3, 2006

(54) VARIABLE DELAY LINE USING TWO BLENDER DELAYS

(75) Inventor: Alessandro Minzoni, Morrisville, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/974,564

(22) Filed: Oct. 27, 2004

(65) Prior Publication Data

US 2006/0087356 A1 Apr. 27, 2006

(51) Int. Cl.
*H03L 7/06* (2006.01)
(52) U.S. Cl. .................................. 327/158; 327/270
(58) Field of Classification Search ................ 327/158, 327/269–274
See application file for complete search history.

(56) References Cited

U.S. PATENT DOCUMENTS

| | | | |
|---|---|---|---|
| 5,544,203 A | 8/1996 | Casasanta et al. | 375/376 |
| 5,604,775 A | 2/1997 | Saitoh et al. | 375/376 |
| 5,844,954 A | 12/1998 | Casasanta et al. | 375/373 |
| 6,101,197 A | 8/2000 | Keeth et al. | 370/517 |
| 6,441,662 B1 * | 8/2002 | Ikeda | 327/160 |
| 6,483,359 B1 * | 11/2002 | Lee | 327/158 |
| 6,489,823 B1 * | 12/2002 | Iwamoto | 327/158 |
| 6,518,807 B1 * | 2/2003 | Cho | 327/158 |
| 2002/0043996 A1 | 4/2002 | Iwamoto | |
| 2002/0196062 A1 | 12/2002 | Iwashita | |
| 2004/0130365 A1 | 7/2004 | Han et al. | |

OTHER PUBLICATIONS

A copy of PCT International Search Report for International Application No. PCT/EP2005/011309 mailed on Feb. 16, 2006 (11 pages).

* cited by examiner

*Primary Examiner*—Kenneth B. Wells
(74) *Attorney, Agent, or Firm*—Dicke, Billig & Czaja, PLLC (57) ABSTRACT

A variable delay line comprises a first blender delay configured to provide a first signal, a second blender delay configured to provide a second signal complementary to the first signal, and a coarse delay configured to delay the first signal if an even number of coarse delay elements are selected and delay the second signal if an odd number of coarse delay elements are selected.

22 Claims, 10 Drawing Sheets

VARIABLE DELAY LINE USING TWO BLENDER DELAYS

BACKGROUND

Variable delay lines are used to delay signals in many different types of circuits, such as delay locked loops (DLLs). Variable delay lines typically include a blender delay and a coarse delay. The coarse delay typically includes a chain of coarse delay elements or units, each coarse delay element delaying an input signal by an equal amount. By selecting the number of coarse delay elements used, a coarse delay value is obtained. The blender delay typically provides a delay between zero and the delay of one coarse delay element. When combined, the blender delay and coarse delay of the variable delay line provide the desired total delay based on a control signal input.

One disadvantage of the blender delay and coarse delay combination is that at the point where the coarse delay is incremented or decremented by one coarse delay element, the blender delay transitions from its minimum delay to its maximum delay or from its maximum delay to its minimum delay. This sudden change in the delay of the blender delay and coarse delay needs to occur during the same phase of the input clock signal to avoid a synchronization problem. The synchronization problem becomes more apparent as the frequency increases. Typically, solutions to the synchronization problem have used multiple delay lines or large multiplexing circuits, both of which increase layout space requirements, current consumption, and costs.

SUMMARY

One embodiment of the present invention provides a variable delay line. The variable delay line comprises a first blender delay configured to provide a first signal, a second blender delay configured to provide a second signal complementary to the first signal, and a coarse delay configured to delay the first signal if an even number of coarse delay elements are selected and delay the second signal if an odd number of coarse delay elements are selected.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
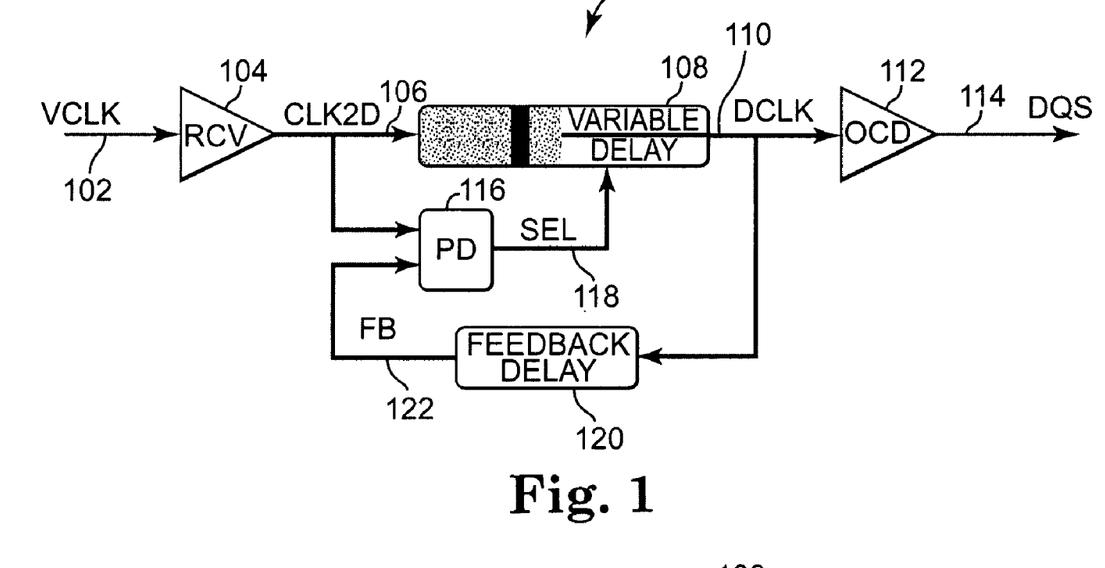
FIG. 1 is a diagram illustrating one embodiment of a delay locked loop (DLL).

FIG. 1 is a diagram illustrating one embodiment of a delay locked loop (DLL) 100. DLL 100 can be used in a variety of different types of circuits, such as in a memory circuit. The memory circuit can be a synchronous dynamic random access memory (SDRAM), double data rate synchronous dynamic random access memory (DDR-SDRAM), etc. DLL 100 includes receiver 104, variable delay line 108, off-chip driver (OCD) 112, phase detector 116, and feedback delay 120. Variable delay line 108 delays a clock signal based on a select signal from phase detector 116.

According to the present invention, variable delay line 108 has no frequency limitations and no synchronization problems. Variable delay line 108 includes two blender delays coupled to a coarse delay. The blender delays provide complementary delays, such that the sum of the delays of the two blender delays equals the delay of one coarse delay element. The coarse delay further delays a signal from one of the blender delays if an even number of coarse delay elements are selected. The coarse delay further delays a signal from the other blender delay if an odd number of coarse delay elements are selected.

Receiver 104 receives a clock signal (VCLK) on VCLK signal path 102. Receiver 104 is electrically coupled to the input of variable delay line 108 and a first input of phase detector 116 through CLK2D signal path 106. Variable delay line 108 is electrically coupled to OCD 112 and the input of feedback delay 120 through DCLK signal path 110. The output of OCD 112 provides the data strobe (DQS) signal on DQS signal path 114. The output of feedback delay 120 is electrically coupled to a second input of phase detector 116 through feedback (FB) signal path 122. The output of phase detector 116 is electrically coupled to the control input of variable delay line 108 through select (SEL) signal path 118.

Receiver 104 buffers the VCLK signal to provide the CLK2D signal. Variable delay line 108 delays the CLK2D signal based on the SEL signal to provide the DCLK signal. Feedback delay 120 compensates for the delay of receiver 104 and OCD 112 and provides the FB signal to phase detector 116. Phase detector 116 compares the FB signal and the CLK2D signal and generates the SEL signal to control variable delay line 108. OCD 112 receives the DCLK signal and outputs the DQS signal on DQS signal path 114. Although variable delay line 108 is illustrated as a portion of DLL 100, variable delay line 108 can be used in a variety of other types of circuits.

Figure 2:
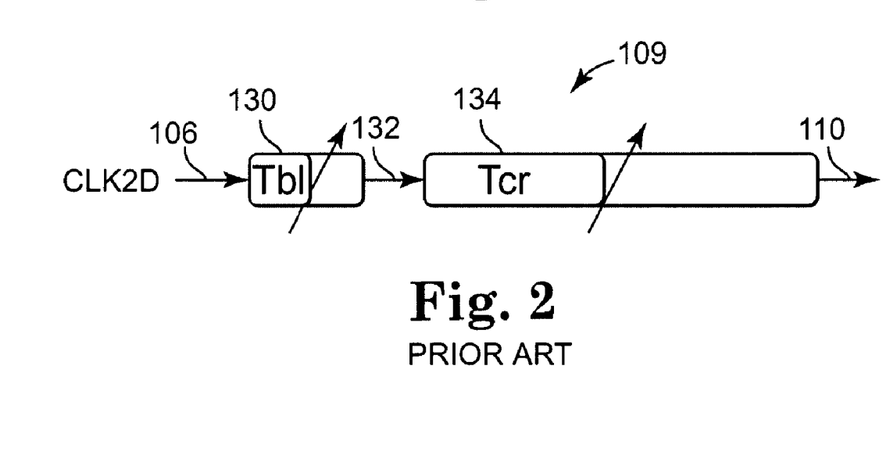
FIG. 2 is a diagram illustrating one embodiment of a prior art variable delay line.

FIG. 2 is a diagram illustrating one embodiment of a prior art variable delay line 109. Variable delay line 109 includes a blender delay 130 and a coarse delay 134. CLK2D signal path 106 is electrically coupled to the input of blender delay 130. The output of blender delay 130 is electrically coupled to the input of coarse delay 134 through signal path 132. The output of coarse delay 134 is electrically coupled to DCLK signal path 110. Coarse delay 134 includes a plurality of delay elements. Each delay element provides a substantially equal delay. The number of delay elements selected is based upon the SEL signal on SEL signal path 118 to provide the desired coarse delay (Tcr). Blender delay 130 provides a delay between zero and the delay of one coarse delay element based on the SEL signal to provide the desired blender delay (Tbl). Therefore, the combination of the delay through blender delay 130 and the delay through coarse delay 134 provides the desired delay.

Figure 3:
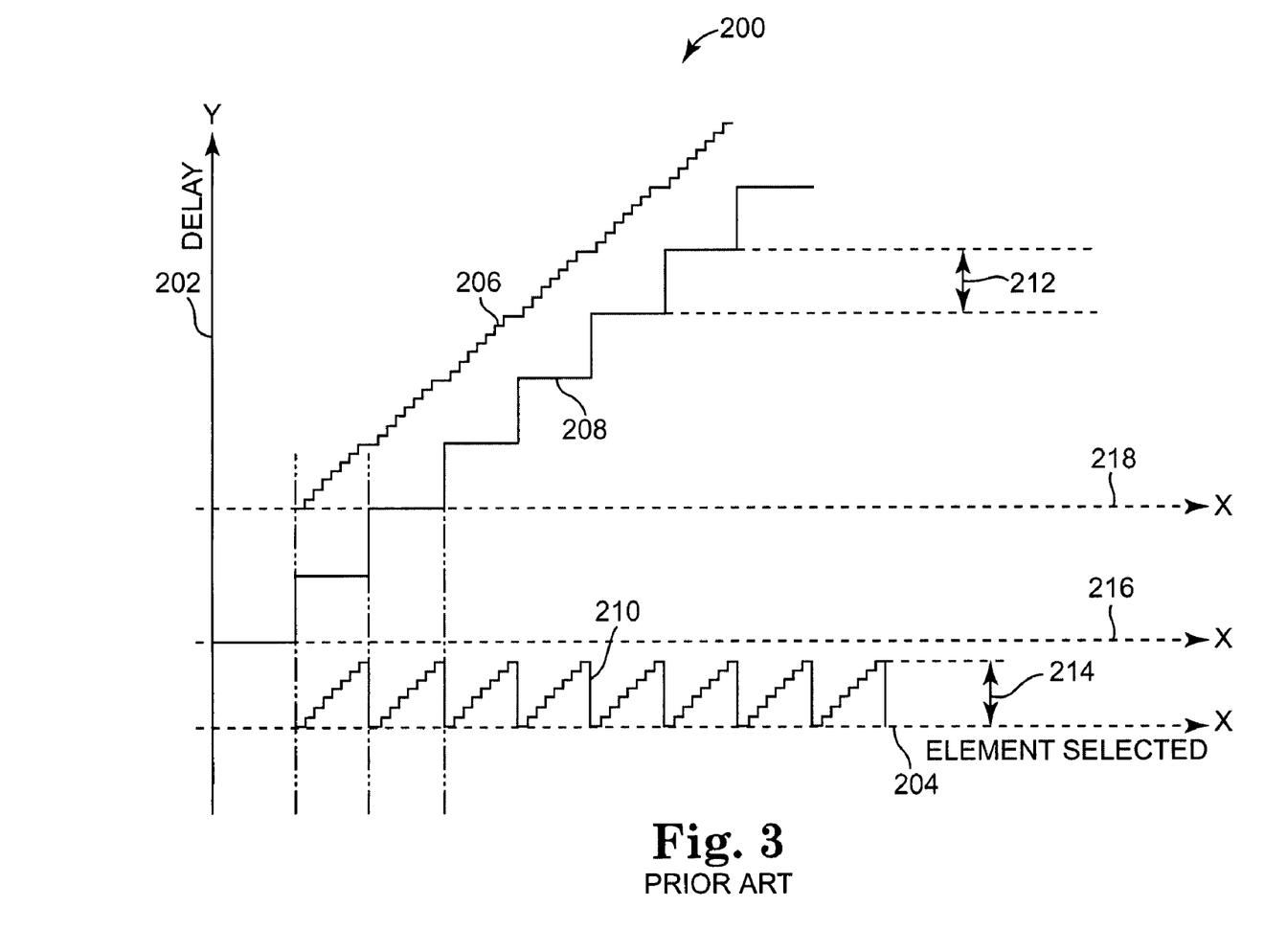
FIG. 3 is a chart illustrating one embodiment of the delay through the prior art delay line.

FIG. 3 is a chart 200 illustrating one embodiment of the delay through prior art delay line 109. Chart 200 includes the delay on y-axis 202 and the element selected on x-axis 204. The x-axis 204 is repeated at 216 and 218. Chart 200 includes delay 210 through blender delay 130, delay 208 through coarse delay 134, and total delay 206 for the combination of the delay through blender delay 130 and coarse delay 134. Delay 210 of blender delay 130 is in reference to x-axis 204 and varies from zero delay to a maximum delay equivalent to the delay of one coarse delay element, as indicated at 214. Delay 208 of coarse delay 134 is in reference to x-axis 216 and varies based on the number of coarse delay elements selected. The delay of each coarse delay element is indicated at 212. Total delay 206 is in reference to x-axis 218 and equals delay 210 of blender delay 130 plus delay 208 of coarse delay 134.

At each point where the number of coarse delay elements selected increments or decrements, delay 210 of blender delay 130 transitions from its minimum delay to its maximum delay or from its maximum delay to its minimum delay. This is known as the synchronization point. As the frequency of the circuit increases, this transition becomes more difficult to achieve, thereby negatively affecting the performance of variable delay line 109.

Figure 4:
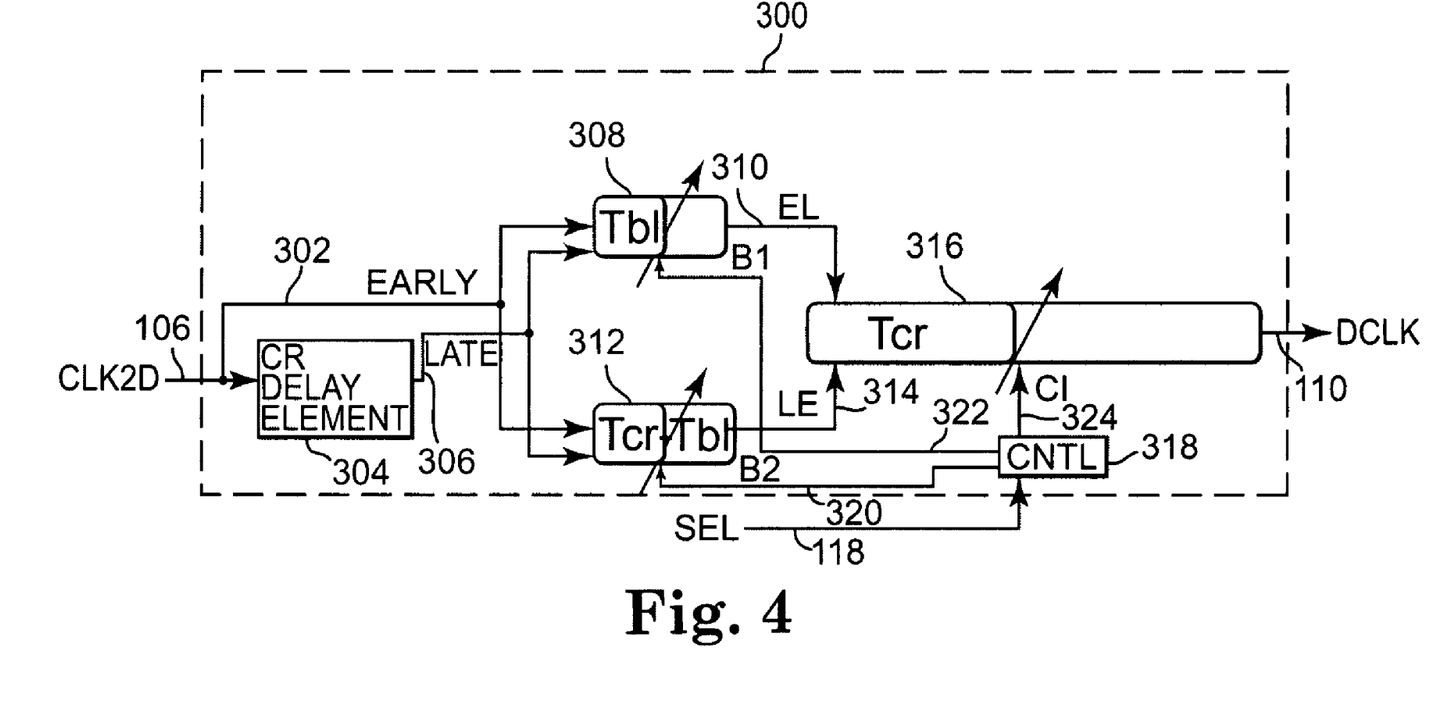
FIG. 4 is a diagram illustrating one embodiment of a variable delay line, according to the present invention.

FIG. 4 is a diagram illustrating one embodiment of a variable delay line 300, according to the present invention. In one embodiment, variable delay line 300 is used in place of variable delay line 108 in DLL 100. Variable delay line 300 includes a coarse delay element 304, blender delays 308 and 312, a coarse delay 316, and a control circuit 318. CLK2D signal path 106 is electrically coupled to the input of coarse delay element 304, a first input of blender delay 308, and a first input of blender delay 312 through EARLY signal path 302. The output of coarse delay element 304 is electrically coupled to a second input of blender delay 308 and a second input of blender delay 312 through LATE signal path 306.

SEL signal path 118 is electrically coupled to the input of control circuit 318. A first output of control circuit 318 is electrically coupled to the control input of blender delay 308 through B1 signal path 322. A second output of control circuit 318 is electrically coupled to the control input of blender delay 312 through B2 signal path 320. A third output of control circuit 318 is electrically coupled to the control input of coarse delay 316 through C1 signal path 324. The output of blender delay 308 is electrically coupled to a first input of coarse delay 316 through EL signal path 310. The output of blender delay 312 is electrically coupled to a second input of coarse delay 316 through LE signal path 314. The output of coarse delay 316 is electrically coupled to DCLK signal path 110.

The CLK2D signal is the same as the EARLY signal on EARLY signal path 302. Coarse delay element 304 receives the EARLY signal and provides the LATE signal on LATE signal path 306. The LATE signal is delayed with respect to the EARLY signal by the delay of one coarse delay element. Blender delay 308 receives the EARLY signal on EARLY signal path 302, the LATE signal on LATE signal path 306, and the B1 signal on B1 signal path 322. Blender delay 308 interpolates between the EARLY signal and the LATE signal based on the B1 signal to provide the EL signal on EL signal path 310. Blender delay 312 receives the EARLY signal on EARLY signal path 302, the LATE signal on LATE signal path 306, and the B2 signal on B2 signal path 320. Blender delay 312 interpolates between the EARLY signal and the LATE signal based on the B2 signal to provide the LE signal on LE signal path 314.

In one embodiment, the B1 signal is complementary to the B2 signal to provide an EL signal that is complementary to the LE signal. The sum of the delay (Tbl) of blender delay 308 and the delay (Tcr-Tbl) of blender delay 312 equals the delay (Tcr) of one coarse delay element. In another embodiment, the EL signal is not complementary to the LE signal, except when the delay of blender delay 308 is at its minimum delay and the delay of blender delay 312 is at its maximum delay, or when the delay of blender delay 308 is at its maximum delay and the delay of blender delay 312 is at its minimum delay.

The B1 signal sets the delay of blender delay 308 to one of any suitable number of values, depending upon the number of bits used to control blender delay 308. The B2 signal sets the delay of blender delay 312 using a value complementary to the value of the B1 signal. In one embodiment, the B1 signal and B2 signal each use three bits to set the delay of blender delay 308 and blender delay 312, respectively. Three bits provides eight possible control settings for blender delay 308 and blender delay 312. For example, if the B1 signal equals "000," then the B2 signal equals a complementary "111." If the B1 signal equals "111," then the B2 signal equals a complementary "000." If the B1 signal equals "001," then the B2 signal equals a complementary "110."

Coarse delay 316 receives the EL signal on EL signal path 310, the LE signal on LE signal path 314, and the C1 signal on C1 signal path 324. The C1 signal selects the coarse delay elements to activate. Coarse delay 316 delays either the EL signal or the LE signal through the selected delay elements based on the C1 signal to provide the DCLK signal on DCLK signal path 110, as described in further detail below with reference to FIGS. 5–7B.

In operation, an input signal is received on CLK2D signal path 106. The CLK2D signal provides the EARLY signal on EARLY signal path 302. The CLK2D signal is delayed by coarse delay element 304 to provide the LATE signal on LATE signal path 306. Control circuit 318 receives the SEL signal from phase detector 116 on SEL signal path 118. Control circuit 318 provides the B1 signal to blender delay 308, the B2 signal to blender delay 312, and the C2 signal to coarse delay 316 to select the desired delay between the DCLK signal and the CLK2D signal. Based on the B1 signal, blender delay 308 interpolates between the EARLY signal and the LATE signal to provide the EL signal. Based on the B2 signal, blender delay 312 interpolates between the EARLY signal and the LATE signal to provide the LE signal, which is complementary to the EL signal. Based on the C1 signal, coarse delay 316 delays either the EL signal or the LE signal by the selected number of delay elements to provide the DCLK signal on DCLK signal path 110.

Figure 5:
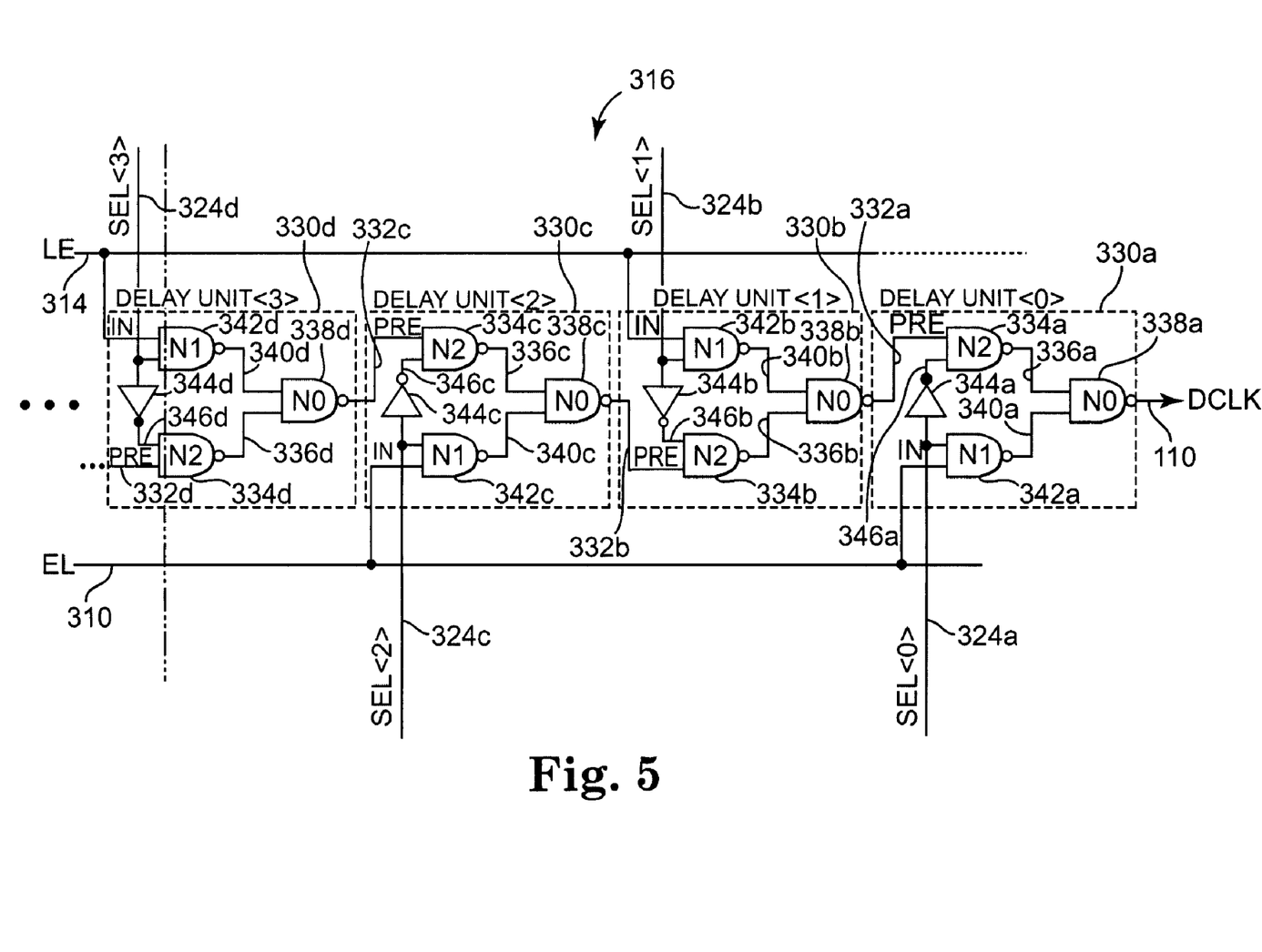
FIG. 5 is a diagram illustrating one embodiment of a coarse delay for the delay line.

FIG. 5 is a diagram illustrating one embodiment of coarse delay 316. Coarse delay 316 includes any suitable number of coarse delay units 330. In this embodiment, delay unit zero 330a, delay unit one 330b, delay unit two 330c, and delay unit three 330*d* are illustrated. Any suitable number of delay units can be placed to the left of delay unit three 330*d* to achieve the desired maximum delay for variable delay line 300. Each delay unit includes a NAND gate N0 338, a NAND gate N1 342, a NAND gate N2 334, and an inverter 344.

Delay unit zero 330*a* includes NAND gate N0 338*a*, NAND gate N1 342*a*, NAND gate N2 334*a*, and inverter 344*a*. A first input of NAND gate N2 334*a* is electrically coupled to the output of NAND gate N0 338*b* through PRE signal path 332*a*. A second input of NAND gate N2 334*a* is electrically coupled to the output of inverter 344*a* through signal path 346*a*. The output of NAND gate N2 334*a* is electrically coupled to a first input of NAND gate N0 338*a* through signal path 336*a*. A first input of NAND gate N1 342*a* is electrically coupled to select zero (SEL<0>) signal path 324*a*. A second input of NAND gate N1 342*a* is electrically coupled to EL signal path 310. The output of NAND gate N1 342*a* is electrically coupled to a second input of NAND gate N0 338*a* through signal path 340*a*. The output of NAND gate 338*a* is electrically coupled to DCLK signal path 110.

Delay unit one 330*b* includes NAND gate N0 338*b*, NAND gate N1 342*b*, NAND gate N2 334*b*, and inverter 344*b*. A first input of NAND gate N2 334*b* is electrically coupled to the output of NAND gate N0 338*c* through PRE signal path 332*b*. A second input of NAND gate N2 334*b* is electrically coupled to the output of inverter 344*b* through signal path 346*b*. The output of NAND gate N2 334*b* is electrically coupled to a first input of NAND gate N0 338*b* through signal path 336*b*. A first input of NAND gate N1 342*b* is electrically coupled to select one (SEL<1>) signal path 324*b*. A second input of NAND gate N1 342*b* is electrically coupled to LE signal path 314. The output of NAND gate N1 342*b* is electrically coupled to a second input of NAND gate N0 338*b* through signal path 340*b*.

Delay unit two 330*c* includes NAND gate N0 338*c*, NAND gate N1 342*c*, NAND gate N2 334*c*, and inverter 344*c*. Delay unit two 330*c* is electrically coupled together similar to delay unit zero 330*a*, except that an input of NAND gate N2 334*c* is electrically coupled to the output of NAND gate N0 338*d* through signal path 332*c*, and an input of NAND gate N1 342*c* is electrically coupled to select two (SEL<2>) signal path 324*c*.

Delay unit three 330*d* includes NAND gate N0 338*d*, NAND gate N1 342*d*, NAND gate N2 334*d*, and inverter 344*d*. Delay unit three 330*d* is electrically coupled together similar to delay unit one 330*b*, except that an input of NAND gate N2 334*d* is electrically coupled to the output of NAND gate N0 of delay unit four (not shown) through PRE signal path 332*d*, and an input of NAND gate N1 342*d* is electrically coupled to select three (SEL<3>) signal path 324*d*.

The even numbered delay units (e.g., 330*a* and 330*c*) have a NAND gate N1 342 input electrically coupled to an even numbered select signal path (e.g., 324*a* and 324*c*, respectively), and a NAND gate N1 342 input electrically coupled to EL signal path 310. The odd numbered delay units (e.g., 330*b* and 330*d*) have a NAND gate N1 342 input electrically coupled to an odd numbered select signal path (e.g., 324*b* and 324*d*), and a NAND gate N1 342 input electrically coupled to LE signal path 314. The pattern continues for delay units to the left of delay unit three 330*d*.

The number of delay units activated is selected by providing a logic high signal on the select signal path of the desired delay unit. For example, a logic high signal on select zero signal path 324*a* activates delay unit zero 330*a*. A logic high signal on select one signal path 324*b*, with a logic low signal on select zero signal path 324*a*, activates delay unit one 330*b* and delay unit zero 330*a*. A logic high signal on select two signal path 324*c*, with a logic low signal on both select zero signal path 324*a* and select one signal path 324*b*, activates delay units 330*a*–330*c*, etc.

For delay unit zero 330*a*, with a logic high signal on select zero signal path 324*a*, NAND gate N1 342*a* is enabled. Inverter 344*a* inverts the logic high signal on select zero signal path 324*a* and provides a logic low signal on signal path 346*a* to disable NAND gate N2 334*a*. NAND gate N2 334*a* outputs a logic high signal on signal path 336*a*. NAND gate N1 342*a* outputs a logic high signal in response to a logic low signal on EL signal path 310 and outputs a logic low signal in response to a logic high signal on EL signal path 310. With a logic high signal on signal path 336*a* and a logic low signal on signal path 340*a*, NAND gate N0 338*a* outputs a logic high signal on DCLK signal path 110. With a logic high signal on signal path 340*a* and a logic high signal on signal path 336*a*, NAND gate N0 338*a* outputs a logic low signal on DCLK signal path 110.

Therefore, with a logic high signal on select zero signal path 324*a*, NAND gate N0 338*a* outputs a logic high signal on DCLK signal path 110 in response to a logic high signal on EL signal path 310. In response to a logic low signal on EL signal path 310, NAND gate N0 338*a* outputs a logic low signal on DCLK signal path 110. The EL signal is delayed by NAND gate N1 342*a* and NAND gate N0 338*a*. The total delay equals the delay of blender delay 308 plus one coarse delay unit.

With a logic high signal on select one signal path 324*b* and a logic low signal on select zero signal path 324*a*, delay unit one 330*b* and delay unit two 330*a* are activated. With a logic high signal on select one signal path 324*b*, NAND gate N1 342*b* is enabled, and NAND gate N2 334*b* is disabled. NAND gate N2 334*b* outputs a logic high signal on signal path 336*b*. With a logic low signal on select zero signal path 324*a*, NAND gate N1 342*a* is disabled and NAND gate N2 334*a* is enabled. NAND gate N1 342*a* outputs a logic high signal on signal path 340*a*.

With a logic high signal on LE signal path 314, NAND gate N1 342*b* outputs a logic low signal on signal path 340*b*. With a logic low signal on signal path 340*b* and a logic high signal on signal path 336*b*, NAND gate 338*b* outputs a logic high signal on signal path 332*a*. With a logic high signal on signal path 332*a* and a logic high signal on signal path 346*a*, NAND gate N2 334*a* outputs a logic low signal on signal path 336*a*. With a logic low signal on signal path 336*a* and a logic high signal on signal path 340*a*, NAND gate N0 338*a* outputs a logic high signal on DCLK signal path 110.

With a logic low signal on LE signal path 314, NAND gate N1 342*b* outputs a logic high signal on signal path 340*b*. With a logic high signal on signal path 340*b* and a logic high signal on signal path 336*b*, NAND gate 338*b* outputs a logic low signal on signal path 332*a*. With a logic low signal on signal path 332*a* and a logic high signal on signal path 346*a*, NAND gate N2 334*a* outputs a logic high signal on signal path 336*a*. With a logic high signal on signal path 336*a* and a logic high signal on signal path 340*a*, NAND gate N0 338*a* outputs a logic low signal on DCLK signal path 110.

Therefore, with a logic high signal on select one signal path 324*b* and a logic low signal on select zero signal path 324*a*, NAND gate N0 338*a* outputs a logic high signal on DCLK signal path 110 in response to a logic high signal on LE signal path 314. In response to a logic low signal on LE signal path 314, NAND gate N0 338*a* outputs a logic low signal on DCLK signal path 110. The LE signal is delayed by NAND gate N1 342*b*, NAND gate N0 338*b*, NAND gate N2 334*a*, and NAND gate N0 338*a*. The total delay equals the delay of blender delay 312 plus two coarse delay units.

Depending upon which select signal path receives a logic high signal, either the LE signal on LE signal path 314 or the EL signal on EL signal path 310 will be delayed through the selected number of delay units. The LE signal and the EL signal are complementary. Therefore, when the LE signal is set for the minimum delay, the EL signal is set to the maximum delay, and when the LE signal is set for the maximum delay, the EL signal is set for the minimum delay. FIGS. 6A–6D illustrate how coarse delay 316 in combination with blender delay 308 and blender delay 312 prevent synchronization problems from occurring.

Figure 6A:
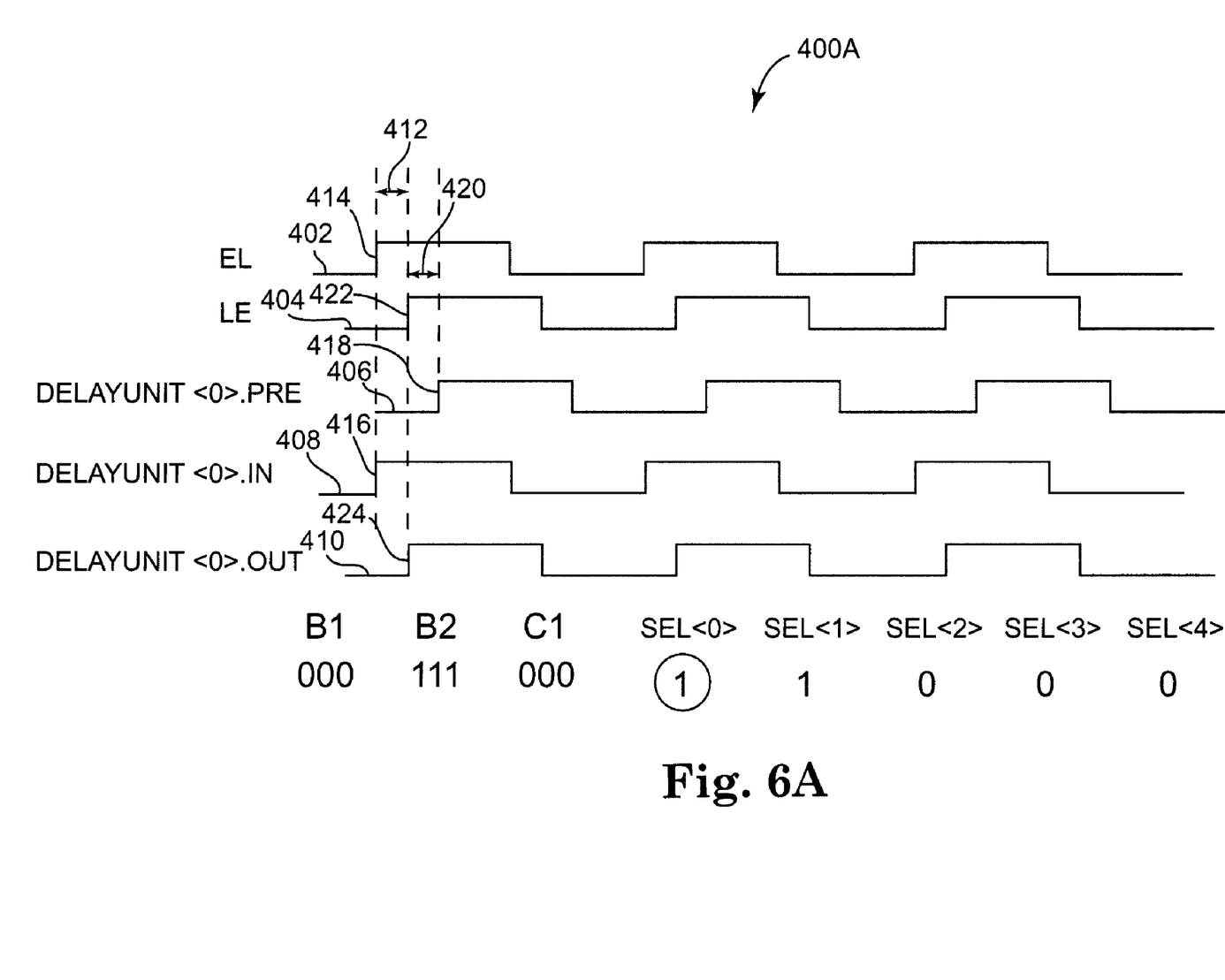
FIG. 6A is a timing diagram illustrating one embodiment of the timing of signals for the variable delay line for an initial delay selection.

FIG. 6A is a timing diagram 400A illustrating one embodiment of the timing of signals for variable delay line 300 for an initial delay selection. In this embodiment, the B1 signal is equal to "000," the B2 signal is equal to "111," and the C1 signal is equal to "000." The "000" value for the C1 signal selects delay unit zero 330*a* in coarse delay 316, the "000" value for the B1 signal selects the minimum or no delay for blender delay 308, and the "111" value for the B2 signal selects the complementary maximum delay for blender delay 312. Timing diagram 400A includes EL signal 402 on EL signal path 310, LE signal 404 on LE signal path 314, delay unit zero PRE signal 406 on PRE signal path 332*a*, delay unit zero IN signal 408 on EL signal path 310, and delay unit zero OUT signal 410 on DCLK signal path 110.

In response to the "000" value on the C1 signal, the select zero signal on select zero signal path 324*a* is a logic high, which enables NAND gate N1 342*a* and disables NAND gate N2 334*a*. For purposes of simplifying the explanation of the invention, the select one signal on select one signal path 324*b* is also a logic high, which enables NAND gate N1 342*b* and disables NAND gate N2 334*b*. It is noted that the select one signal has no affect on the DCLK signal with the select zero signal at a logic high.

With the minimum delay selected for blender delay 308 and the maximum delay selected for blender delay 312, rising edge 422 of LE signal 404 is delayed with respect to rising edge 414 of EL signal 402 by the delay of one coarse delay unit, as indicated at 412. Rising edge 414 of EL signal 402 is the same as rising edge 416 of delay unit zero IN signal 408. Rising edge 418 of delay unit zero PRE signal 406 is delayed with respect to rising edge 422 of LE signal 404 by the delay of one coarse delay unit through NAND gate N1 342*b* and NAND gate N0 338*b*, as indicated at 420. Rising edge 424 of delay unit zero OUT signal 410 is delayed with respect to rising edge 414 of EL signal 402 by the delay of one coarse delay unit through NAND gate N1 342*a* and NAND gate N0 338*a*, as indicated at 412. Therefore, the total delay for the current delay selection is equal to the delay of one coarse delay element. In particular, the total delay is equal to the delay through NAND gate N1 342*a* and NAND gate N0 338*a*, since the delay through blender delay 308 is equal to zero.

Figure 6B:
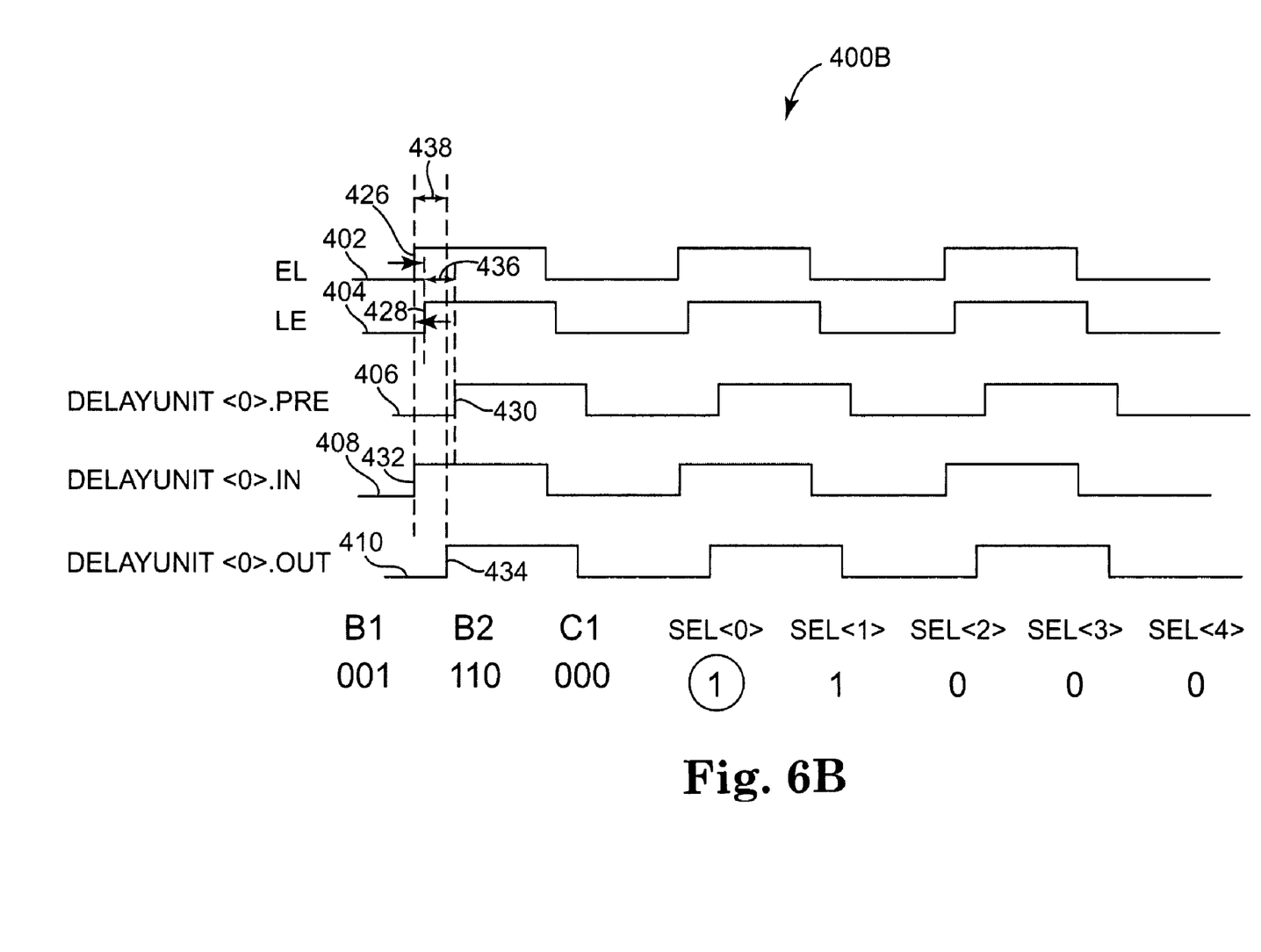
FIG. 6B is a timing diagram illustrating one embodiment of the timing of signals for the variable delay line for a change in the delay selection.

FIG. 6B is a timing diagram 400B illustrating one embodiment of the timing of signals for variable delay line 300 after the B1 signal is increased to "001" and the B2 signal is decreased to "110." Rising edge 426 of EL signal 402 is delayed with respect to rising edge 414 (FIG. 6A) of EL signal 402 by one seventh of the delay of one coarse delay element through blender delay 308. Rising edge 428 of LE signal 404 precedes rising edge 422 (FIG. 6A) of LE signal 404 by one seventh of the delay of one coarse delay element through blender delay 312. Rising edge 426 of EL signal 402 is the same as rising edge 432 of delay unit zero IN signal 408. Rising edge 430 of delay unit zero PRE signal 406 is delayed with respect to rising edge 428 of LE signal 404 by the delay of one coarse delay unit through NAND gate N1 342*b* and NAND gate N0 338*b*, as indicated at 436. Rising edge 434 of delay unit zero OUT signal 410 is delayed with respect to rising edge 426 of EL signal 402 by the delay of one coarse delay unit through NAND gate N1 342*a* and NAND gate N0 338*a*, as indicated at 438. Therefore, the total delay for the current delay selection is equal to the delay of one coarse delay element plus the delay of blender delay 308. In particular, the total delay is equal to one seventh of the delay of one coarse delay element through blender delay 308 plus the delay through NAND gate N1 342*a* and NAND gate N0 338*a*, for a total delay of one and one seventh coarse delay elements.

Figure 6C:
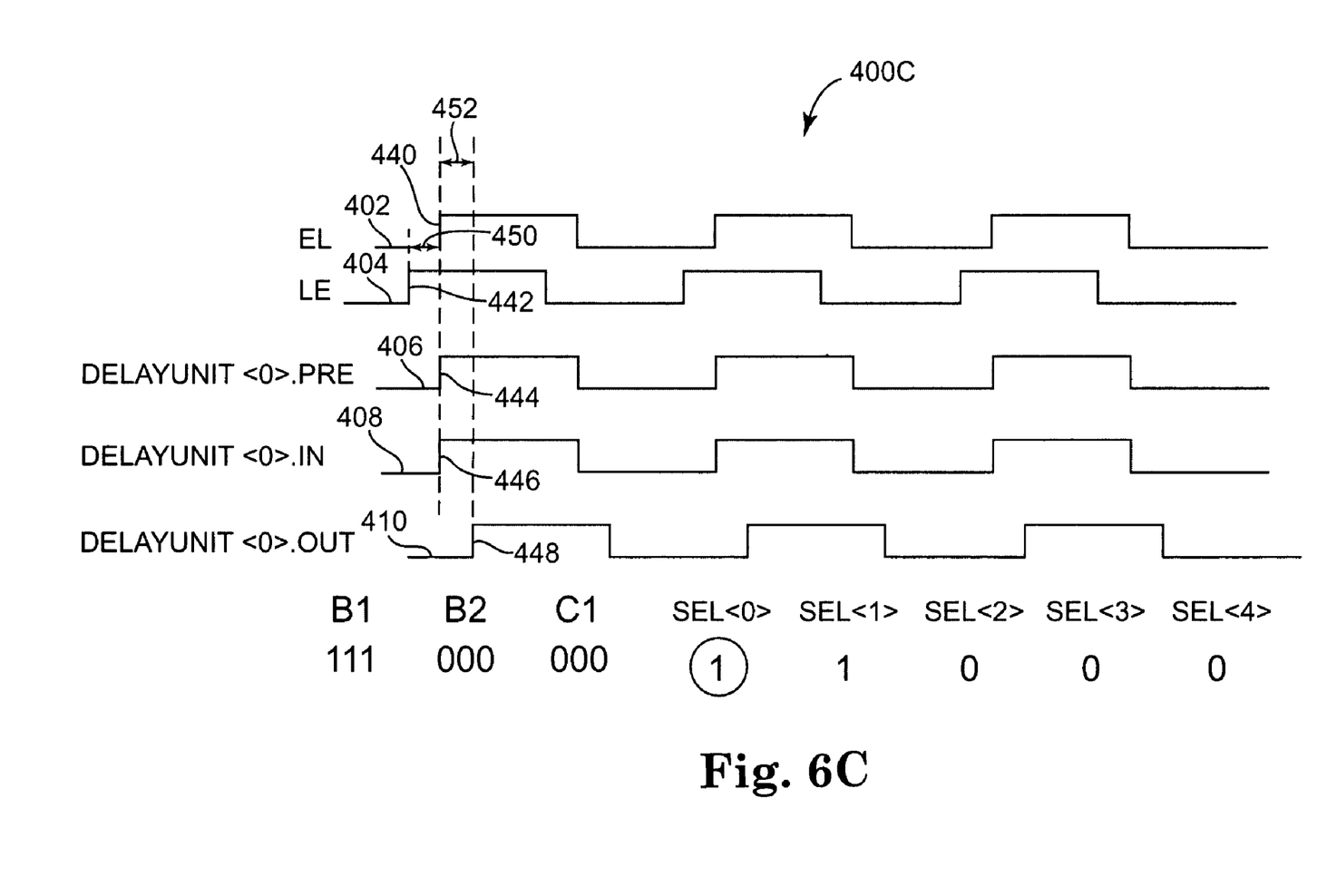
FIG. 6C is a timing diagram illustrating one embodiment of the timing of signals for the variable delay line for another change in the delay selection.

FIG. 6C is a timing diagram 400C illustrating one embodiment of the timing of signals for variable delay line 300 after the B1 signal is increased to "111" and the B2 signal is decreased to "000." With the maximum delay selected for blender delay 308 and the minimum delay selected for blender delay 312, rising edge 440 of EL signal 402 is delayed with respect to rising edge 442 of LE signal 404 by the delay of one coarse delay element through blender delay 308, as indicated at 450. Rising edge 440 of EL signal 402 is the same as rising edge 446 of delay unit zero IN signal 408. Rising edge 444 of delay unit zero PRE signal 406 is delayed with respect to rising edge 442 of LE signal 404 by the delay of one coarse delay unit through NAND gate N1 342*b* and NAND gate N0 338*b*, as indicated at 450. Rising edge 448 of delay unit zero OUT signal 410 is delayed with respect to rising edge 440 of EL signal 402 by the delay of one coarse delay unit through NAND gate N1 342*a* and NAND gate N0 338*a*, as indicated at 452.

Therefore, the total delay for the current delay selection is equal to the delay of one coarse delay element plus the delay of blender delay 308. In particular, the total delay is equal to the delay of one coarse delay element through blender delay 308 plus the delay through NAND gate N1 342*a* and NAND gate N0 338*a*, for a total delay of two coarse delay units. It is noted that rising edge 444 of delay unit zero PRE signal 406 is aligned with rising edge 446 of delay unit zero IN signal 408.

Figure 6D:
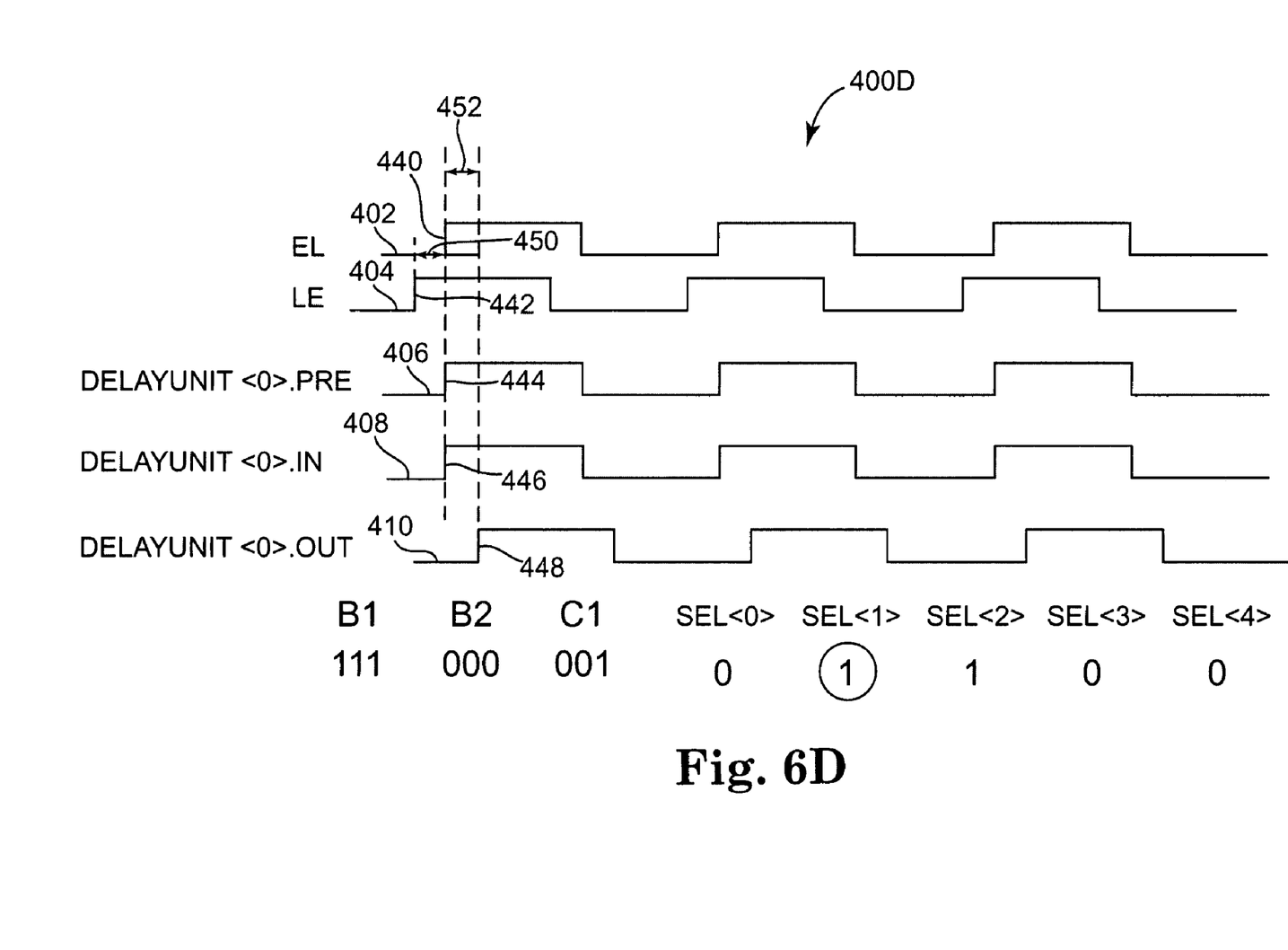
FIG. 6D is a timing diagram illustrating one embodiment of the timing of signals for the variable delay line for another change in the delay selection.

FIG. 6D is a timing diagram 400D illustrating one embodiment of the timing of signals for variable delay line 300 after the C1 signal is increased to "001." In response to the "001" value of the C1 signal, the select zero signal on select zero path 324*a* is a logic low, and the select one signal on select one signal path 324*b* is a logic high. A logic high signal on select one signal path 324*b* enables NAND gate N1 342*b* and disables NAND gate N2 334*b*. For purposes of simplifying the explanation of the invention, the select two signal on select two signal path 324*c* is also a logic high, which enables NAND gate N1 342*c* and disables NAND gate N2 334*c*. It is noted that the select two signal has no affect on the DCLK signal with the select one signal at a logic high.

The rising edges 440–448 and delays 450 and 452 of timing diagram 400D are identical to the rising edges and delays having the same reference numbers in timing diagram 400C. The total delay is also the same, however, in this case the delay is obtained through NAND gate N1 342*b*, NAND gate N0 338*b*, NAND gate N2 334*a*, and NAND gate N0 338*a*. This is due to the alignment of rising edge 444 of delay unit zero PRE signal 406 and rising edge 446 of delay unit zero IN signal 446. Therefore, the transition from coarse delay unit zero to coarse delay unit one does not result in any change in the total delay. There is no synchronization problem with variable delay 300 since blender delay 308 and blender delay 312 provide a smooth transition between coarse delay units. The smooth transition occurs when switching between a lower number of coarse delay units to a higher number of coarse delay units to increase the total delay and when switching between a higher number of coarse delay units to a lower number of coarse delay units to decrease the total delay.

Figure 7A:
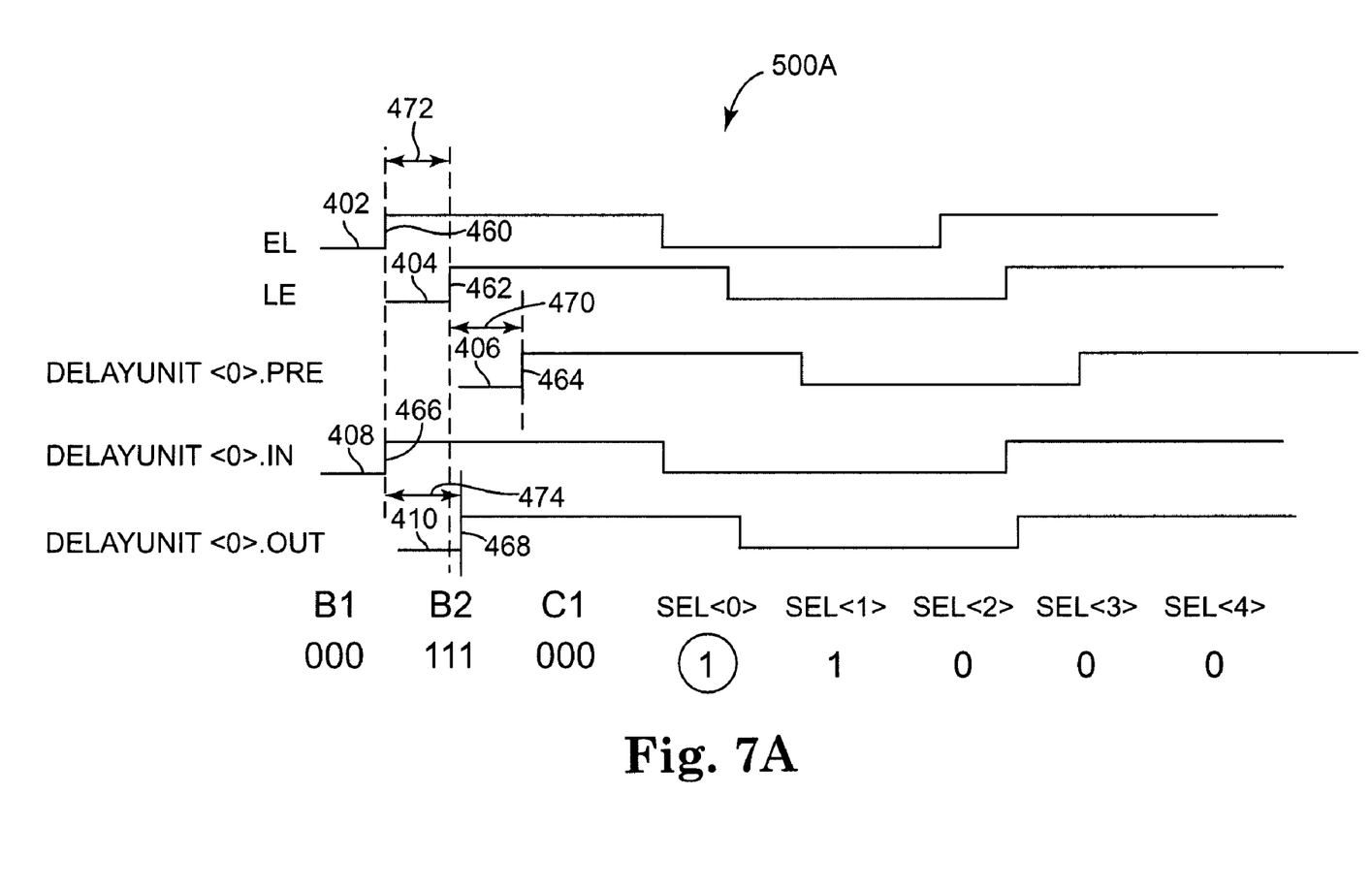
FIG. 7A is a timing diagram illustrating one embodiment of the timing of signals for the variable delay line if the delays through portions of the coarse delay elements are not equal and for an initial delay selection.

FIG. 7A is a timing diagram 500A illustrating one embodiment of the timing of signals for variable delay line 300 if the delay through a NAND gate N2 334 and a NAND gate N0 338 is not equal to the delay through a NAND gate N1 342 and a NAND gate N0 338. In this embodiment, the B1 signal is set to "000," the B2 signal is set to "111," and the C1 signal is set to "000." The "000" value for the C1 signal selects delay unit zero 330a in coarse delay 316, the "000" value for the B1 signal selects the minimum or no delay for blender delay 308, and the "111" value for the B2 signal selects the complementary maximum delay for blender delay 312.

In response to the "000" value on the C1 signal, the select zero signal on select zero signal path 324a is a logic high, which enables NAND gate N1 342a and disables NAND gate N2 334a. For purposes of simplifying the explanation of the invention, the select one signal on select one signal path 324b is also a logic high, which enables NAND gate N1 342b and disables NAND gate N2 334b. It is noted that the select one signal has no affect on the DCLK signal with the select zero signal at a logic high.

With the minimum delay selected for blender delay 308 and the maximum delay selected for blender delay 312, rising edge 462 of LE signal 404 is delayed with respect to rising edge 460 of EL signal 402 by the delay of one coarse delay unit, as indicated at 472. In this embodiment, the delay of one coarse delay unit is equal to the delay through a NAND gate N2 334 and a NAND gate N0 338. Rising edge 460 of EL signal 402 is the same as rising edge 466 of delay unit zero IN signal 408. Rising edge 464 of delay unit zero PRE signal 406 is delayed with respect to rising edge 462 of LE signal 404 by the delay of one coarse delay unit plus an error delay through NAND gate N1 342b and NAND gate N0 338b, as indicated at 470. Rising edge 468 of delay unit zero OUT signal 410 is delayed with respect to rising edge 460 of EL signal 402 by the delay of one coarse delay unit plus the error delay through NAND gate N1 342a and NAND gate N0 338a, as indicated at 474. Therefore, the total delay for the current delay selection is equal to the delay of one coarse delay element plus the error delay. In particular, the total delay is equal to the delay through NAND gate N1 342a and NAND gate N0 338a, which is greater than the delay through NAND gate N2 334a and NAND gate N0 338a by the error delay.

Figure 7B:
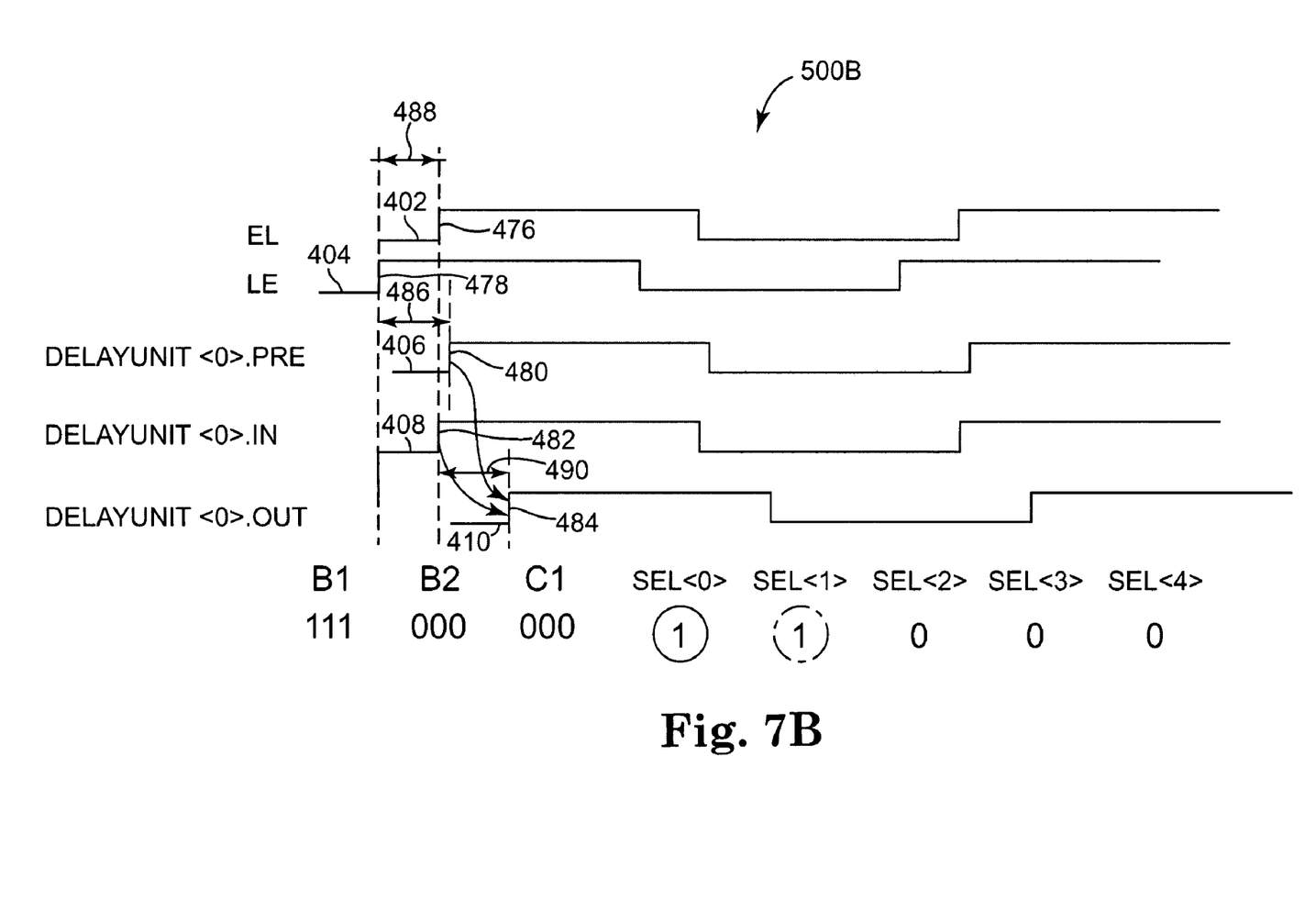
FIG. 7B is a timing diagram illustrating one embodiment of the timing of signals for the variable delay line if the delays through portions of the coarse delay elements are not equal and for a change in the delay selection.

FIG. 7B is a timing diagram 500B illustrating another embodiment of the timing of signals for variable delay line 300 if the delay through a NAND gate N2 334 and a NAND gate N0 338 is not equal to the delay through a NAND gate N1 342 and a NAND gate N0 338. In this embodiment, the B1 signal is set to "111" and the B2 signal set to "000." With the maximum delay selected for blender delay 308 and the minimum delay selected for blender delay 312, rising edge 476 of EL signal 402 is delayed with respect to rising edge 478 of LE signal 404 by the delay of one coarse delay element through blender delay 308, as indicated at 488. Rising edge 476 of EL signal 402 is the same as rising edge 482 of delay unit zero IN signal 408. Rising edge 480 of delay unit zero PRE signal 406 is delayed with respect to rising edge 478 of LE signal 404 by the delay of one coarse delay unit plus the error delay through NAND gate N1 342b and NAND gate N0 338b, as indicated at 486. Rising edge 484 of delay unit zero OUT signal 410 is delayed with respect to rising edge 476 of EL signal 402 by the delay of one coarse delay unit plus the error delay through NAND gate N1 342a and NAND gate N0 338a, as indicated at 490.

Therefore, the total delay for the current delay selection is equal to the delay of one coarse delay element plus the error delay plus the delay of blender delay 308. In particular, the total delay is equal to the delay through blender delay 308 plus the delay through NAND gate N1 342a and NAND gate N0 338a, for a total delay of two coarse delay units plus the error delay. It is noted in this case, that rising edge 480 of delay unit zero PRE signal 406 is not aligned with rising edge 482 of delay unit zero IN signal 408 due to the error delay.

If the C1 signal is increased to "001," rising edges 476–484 do not change. The total delay also does not change, however, in this case the delay is obtained through NAND gate N1 342b, NAND gate N0 338B, NAND gate N2 334a, and NAND gate N0 338a. The delay through NAND gate N1 342b, NAND gate N0 338B, NAND gate N2 334a, and NAND gate N0 338a is equivalent to the delay through blender delay 308 and NAND gate N1 342a and NAND gate N0 338a. Before the change in the C1 signal, the error delay is added as part of the delay through NAND gate N1 342a and NAND gate N0 338a. After the change in the C1 signal, the error delay is added as part of the delay through NAND gate N1 342b and NAND gate N0 338b. Therefore, a difference in the delay through a NAND gate N2 334 and a NAND gate N0 338 and through a NAND gate N1 342 and a NAND gate N0 338 does not negatively impact the synchronization of variable delay line 300. Rising edge 484 of delay unit zero OUT signal 410 does not shift when the coarse delay unit selection changes.

Variable delay line 300 provides many advantages over the prior art, including improvements in layout space requirements, improvements in power consumption requirements for high frequency applications, and improvements in the speed in changing the delay selection. Variable delay line 300 also eliminates synchronization problems when switching the number of coarse delay units selected. Variable delay line 300 is useful in a variety of circuits, including DLLs used in memory circuits, such as SDRAMs.

What is claimed is:

1. A variable delay line comprising:
   a first blender delay configured to provide a first signal;
   a second blender delay configured to provide a second signal complementary to the first signal; and
   a coarse delay configured to delay the first signal if an even number of coarse delay elements are selected and delay the second signal if an odd number of coarse delay elements are selected,
   wherein the first blender delay is configured to interpolate between an early signal and a late signal based on a first control signal to provide the first signal.

2. The variable delay line of claim 1, wherein the first blender delay is configured to provide a maximum delay for the first signal before the coarse delay switches from an even number of coarse delay elements to an adjacent higher odd number of coarse delay elements.

3. The variable delay line of claim 1, wherein the first blender delay is configured to provide a minimum delay for the first signal before the coarse delay switches from an odd number of coarse delay elements to an adjacent lower even number of coarse delay elements.

4. The variable delay line of claim 1, wherein the second blender delay is configured to provide a maximum delay for the second signal before the coarse delay switches from an odd number of coarse delay elements to an adjacent higher even number of coarse delay elements.

5. The variable delay line of claim 1, wherein the second blender delay is configured to provide a minimum delay for the second signal before the coarse delay switches from an even number of coarse delay elements to an adjacent lower odd number of coarse delay elements.

6. The variable delay line of claim 1, wherein the second blender delay is configured to provide the second signal having a delay equal to a delay of a coarse delay element minus a delay of the first signal.

7. The variable delay line of claim 1, wherein the second blender delay is configured to interpolate between the early signal and the late signal based on a second control signal to provide the second signal.

8. The variable delay line of claim 7, wherein the late signal is delayed with respect to the early signal by a delay of a coarse delay element.

9. The variable delay line of claim 7, wherein the first control signal is a complement of the second control signal.

10. A circuit comprising:
a first blender delay configured to interpolate between an early signal and a late signal to provide a first signal;
a second blender delay configured to interpolate between the early signal and the late signal to provide a second signal complementary to the first signal; and
a coarse delay comprising a chain of even numbered delay units and odd numbered delay units, the even numbered delay units coupled to the first blender delay to receive the first signal and the odd numbered delay units coupled to the second blender delay to receive the second signal.

11. The circuit of claim 10, wherein the late signal is delayed with respect to the early signal by a delay of one coarse delay unit.

12. The circuit of claim 10, wherein the even numbered delay units are selected by an even numbered selection signal and the odd numbered delay units are selected by an odd numbered selection signal.

13. A variable delay comprising:
means for receiving a clock signal;
means for delaying the clock signal by a delay of a coarse delay element to provide a late signal;
means for interpolating between the clock signal and the late signal to provide a first signal based on a first control signal;
means for interpolating between the clock signal and the late signal to provide a second signal based on a second control signal, the second control signal a complement of the first control signal;
means for delaying the first signal through an even number of coarse delay elements if an even number of coarse delay elements are selected; and
means for delaying the second signal through an odd number of coarse delay elements if an odd number of coarse delay elements are selected.

14. A memory circuit comprising:
a delay looked loop comprising a variable delay line, the variable delay line comprising:
a first blender delay configured to provide a first delayed signal;
a second blender delay configured to provide a second delayed signal complementary to the first delayed signal; and
a coarse delay configured to delay the first delayed signal if an even number of coarse delay elements are selected and delay the second delayed signal if an odd number of coarse delay elements are selected; and
a memory coupled to the delay looked loop,
wherein the first blender delay is configured to interpolate between an early signal and a late signal based on a first control signal to provide the first signal.

15. The memory circuit of claim 14, wherein the memory comprises a synchronous dynamic random access memory.

16. The memory circuit of claim 14, wherein the memory comprises a double data rate synchronous dynamic random aecess memory.

17. A method for delaying a clock signal through a variable delay line, the method comprising:
receiving a clock signal;
delaying the clock signal by a coarse delay element to provide a late signal;
interpolating between the clock signal and the late signal to provide a first signal based on a first control signal;
interpolating between the clock signal and the late signal to provide a second signal based on a second control signal, the second control signal a complement of the first control signal;
delaying the first signal through an even number of coarse delay elements if an even number of coarse delay elements are selected; and delaying the second signal through an odd number of coarse delay elements if an odd number of coarse delay elements are selected.

18. The method of claim 17, further comprising:
switching from an even number of coarse delay elements to an adjacent higher odd number of coarse delay elements if the first signal is delayed by one coarse delay element.

19. The method of claim 17, further comprising:
switching from an odd number of coarse delay elements to an adjacent lower even number of coarse delay elements if the first signal is not delayed.

20. The method of claim 17, further comprising:
switching from an odd number of coarse delay elements to a adjacent higher even number of coarse delay elements if the second signal is delayed by one coarse delay element.

21. The method of claim 17, further comprising:
switching from an even number of coarse delay elements to an adjacent lower odd number of coarse delay elements if the second signal is not delayed.

22. A variable delay line comprising:
a first blender delay configured to provide a first signal;
a second blender delay configured to provide a second signal;
a coarse delay configured to delay the first signal if an even number of coarse delay elements are selected and delay the second signal if an odd number of coarse delay elements are selected;
wherein the first blender delay is configured to provide a maximum delay for the first signal before the coarse delay switches from an even number of coarse delay elements to an adjacent higher odd number of coarse delay elements;
wherein the first blender delay is configured to provide a minimum delay for the first signal before the coarse delay switches from an odd number of coarse delay elements to an adjacent lower even number of coarse delay elements;

wherein the first blender delay is configured to interpolate between an early signal and a late signal based on a first control signal to provide the first signal;

wherein the second blender delay is configured to provide a maximum delay for the second signal before the coarse delay switches from an odd number of coarse delay elements to an adjacent higher even number of coarse delay elements; and wherein the second blender delay is configured to provide a minimum delay for the second signal before the coarse delay switches from an even number of coarse delay elements to an adjacent lower odd number of coarse delay elements.

* * * * *